(12) United States Patent
Koh et al.

(10) Patent No.: US 8,115,845 B2
(45) Date of Patent: Feb. 14, 2012

(54) COUNTER ARRAY AND IMAGE SENSOR INCLUDING THE SAME

(75) Inventors: Kyoung Min Koh, Hwaseong-si (KR); Kyung-Min Kim, Suwon-si (KR); Yong Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 449 days.

(21) Appl. No.: 12/320,624

(22) Filed: Jan. 30, 2009

(65) Prior Publication Data

US 2009/0195682 A1    Aug. 6, 2009

(30) Foreign Application Priority Data

Feb. 1, 2008  (KR) .................. 10-2008-0010663

(51) Int. Cl.
*H04N 3/14* (2006.01)
*H04N 5/335* (2011.01)
(52) U.S. Cl. ...... 348/303; 348/308; 348/310; 250/208.1
(58) Field of Classification Search .................. 348/294, 348/241
See application file for complete search history.

(56) References Cited

U.S. PATENT DOCUMENTS

| 6,757,018 | B1 * | 6/2004 | Fowler ........................ 348/301 |
| 7,292,177 | B2 * | 11/2007 | Muramatsu et al. .......... 341/164 |
| 7,518,646 | B2 * | 4/2009 | Zarnowski et al. ........... 348/302 |
| 7,642,947 | B2 * | 1/2010 | Suzuki et al. ................ 341/169 |
| 7,671,317 | B2 * | 3/2010 | Shimomura et al. ....... 250/208.1 |
| 7,952,630 | B2 * | 5/2011 | Taura ........................... 348/294 |

FOREIGN PATENT DOCUMENTS

| JP | 06-053818 | 2/1994 |
| JP | 2002-176353 | 6/2002 |
| JP | 2003-283331 | 10/2003 |
| JP | 2006-005954 | 1/2006 |

* cited by examiner

*Primary Examiner* — Ngoc-Yen Vu
(74) *Attorney, Agent, or Firm* — Harness, Dickey & Pierce, P.L.C.

(57) ABSTRACT

A counter array and an image sensor including the same may be provided. The counter array may include a controller and a plurality of counter units. The controller may output an operation control signal and a direction indication signal. The counter units hold previous output values or may perform a counting operation in response to the operation control signal and may perform an up-count operation or a down-count operation in response to the direction indication signal when performing the counting operation.

19 Claims, 6 Drawing Sheets

COUNTER ARRAY AND IMAGE SENSOR INCLUDING THE SAME

PRIORITY STATEMENT

This application claims the benefit of priority under 35 U.S.C. §119 to Korean Patent Application No. 10-2008-0010663, filed on Feb. 1, 2008, in the Korean Intellectual Property Office, the entire contents of which is incorporated herein by reference

BACKGROUND

1. Field

Example embodiments relate to a counter array and an image sensor including the same, and more particularly, to a counter array to reduce power consumption by decreasing the number of bits toggled at one time and to increase an operating margin by improving an occurrence where a voltage decreases due to an instant current change, and an image sensor including the same.

2. Description of Related Art

An image sensor captures an image using the properties of a semiconductor acting upon light. With the development of complementary metal-oxide semiconductor (CMOS) technology, CMOS image sensors using CMOS have spread and are widely utilized. A CMOS image sensor may convert an analog signal output from an active pixel sensor (APS) array into a digital signal. For this conversion, a CMOS image sensor may use an analog-to-digital converter (ADC).

CMOS image sensors may be classified into a single ADC scheme or a column ADC scheme according to implementation of analog-to-digital conversion. The single ADC scheme may convert analog pixel signals output from all columns into digital signals within a given time using a single ADC that operates at high speed. Although the single ADC scheme may reduce a chip area, it has higher power consumption because it operates at higher speed. The column ADC scheme may include simpler ADC circuits provided in each of the columns and the column ADC scheme has lower power consumption as compared to the single ADC scheme. Also, the column ADC may include a counter, for example, an up/down counter. The up/down counter may compare a pixel signal output from an APS array with a ramp signal output from an external ramp signal generator and may count a state transition time with respect to a comparison signal output as a comparison result.

Conventional up/down counters may use a binary coded decimal (BCD) codeword scheme including a plurality of flip-flops. The BCD codeword scheme may use a large number of bits (for example, more than one) that are toggled at one time, thereby increasing an instant current change in the up/down counters. For example, when a counter that outputs a 4-bit BCD codeword performs an up-count operation, if the current output of the counter is "0111", its next output is "1000". At this time, a maximum of four bits are toggled in the counter. In other words, a counter that outputs an N-bit BCD codeword may have a maximum of N toggled bits where N is a natural number.

The increase of an instant current change in the counter may cause the operating margin of the counter to decrease when a current drop occurs during a high-speed operation of the counter and may lead to a fault of an image sensor.

SUMMARY

Example embodiments provide a counter array to increase an operating margin by reducing an operating current and an instant current change during design of a column counter to realize digital correlated double sampling (CDS).

According to example embodiments, a counter array may include a controller configured to output an operation control signal and a direction indication signal. Further, the counter array may include a plurality of counter units configured to one of hold previous output values and a counter operation in response to the operation control signal. The counter operation may perform one of an up-count operation and a down-count operation in response to the direction indication signal.

According to an example embodiment, each counter unit of the plurality of counter units may include a first latch, a second latch, a first switch unit, and a second switch unit. The first latch may be configured to output first and second output signals of the first latch. The second latch may be configured to output first and second output signals of the second latch. The first switch unit may be configured to transmit one of the first output signal of the first latch, the first output signal of the second latch, and the second output signal of the second latch to an input terminal of the first latch in response to the operation control signal and the direction indication signal. The second switch unit may be configured to transmit one of the first output signal of the first latch, the second output signal of the first latch, and the first output signal of the second latch to an input terminal of the second latch in response to the operation control signal and the direction indication signal.

According to an example embodiment, each of the first switch units may include a first switch and a second switch. The first switch may be configured to output one of the first output signal of the second latch and the second output signal of the second latch in response to the direction indication signal. The second switch may be configured to output one of the first output signal of the first latch and an output signal of the first switch to the input terminal of the first latch in response to the operation control signal.

According to an example embodiment, each of the second switch units may include a third switch and a fourth switch. The third switch may be configured to output one of the first output signal of the first latch and the second output signal of the first latch in response to the direction indication signal. The fourth switch may be configured to output one of the first output signal of the second latch and an output signal of the third switch to the input terminal of the second latch in response to the operation control signal.

According to an example embodiment, each of the first latches and the second latches may be a D flip-flop.

According to an example embodiment, a clock output signal outputted by a preceding counter unit of the plurality of counter units may be inputted to a succeeding counter unit in the plurality of counter units as a clock input signal.

According to an example embodiment, each counter unit of the plurality of counter units may output a 2-bit gray codeword and may include a decoder configured to convert the 2-bit gray codeword into a binary coded decimal (BCD) codeword.

According to an example embodiment, the decoder may include a plurality of XOR gates.

According to example embodiments, an image sensor may include: an active pixel sensor (APS) array configured to sense light and output an image signal; a ramp generator configured to output a ramp signal; a controller configured to output a direction indication signal and a control signal; a comparator configured to compare the ramp signal with the image signal and output a comparison signal; a control signal generator configured to output an operation control signal in response to the control signal and the comparison signal; and a counter array including a counter unit configured to one of hold previous output values and a counting operation in response to the operation control signal. The counter operation may perform one of an up-count operation and a down-count operation in response to the direction indication signal.

According to an example embodiment, the counter unit may include: a first latch, a second latch, a first switch unit, and a second switch unit. The first latch may be configured to output first and second output signals of the first latch. The second latch may be configured to output first and second output signals of the second latch. The first switch unit may be configured to transmit one of the first output signal of the first latch, the first output signal of the of the second latch, and the second output signal of the second latch to an input terminal of the first latch in response to the operation control signal and the direction indication signal. The second switch unit may be configured to transmit one of the first output signal of the first latch, the second output signal of the first latch, and the first output signal of the second latch to an input terminal of the second latch in response to the operation control signal and the direction indication signal.

According to an example embodiment, the first switch unit may include a first switch and a second switch. The first switch may be configured to output one of the first output signal of the second latch and the second output signal of the second latch in response to the direction indication signal. The second switch may be configured to output one of the first output signal of the first latch and an output signal of the first switch to the input terminal of the first latch in response to the operation control signal.

According to an example embodiment, the second unit may include a third switch and fourth switch. The third switch may be configured to output one of the first output signal of the first latch and a second output signal of the first latch in response to the direction indication signal. The fourth switch may be configured to output one of the first output signal of the second latch and an output signal of the third switch to the input terminal of the second latch in response to the operation control signal.

According to an example embodiment, the first latch and the second latch may be D flip-flops.

According to an example embodiment, the counter unit may output a 2-bit gray codeword and may include a decoder configured to convert the 2-bit gray codeword into a binary coded decimal (BCD) codeword.

According to an example embodiment, the decoder may include a plurality of XOR gates.

According to an example embodiment, the image sensor may be a CMOS image sensor.

According to an example embodiment, the CMOS image sensor may include a single analog-to-digital convertor scheme.

According to an example embodiment, the CMOS image sensor may include a column analog-to-digital convertor scheme.

According to an example embodiment, the CMOS image sensor may be used during digital correlated double sampling.

BRIEF DESCRIPTION OF THE DRAWINGS

The above and other features and advantages will become more apparent by describing in detail example embodiments thereof with reference to the attached drawings in which.

DETAILED DESCRIPTION OF EXAMPLE EMBODIMENTS

Figure 1:
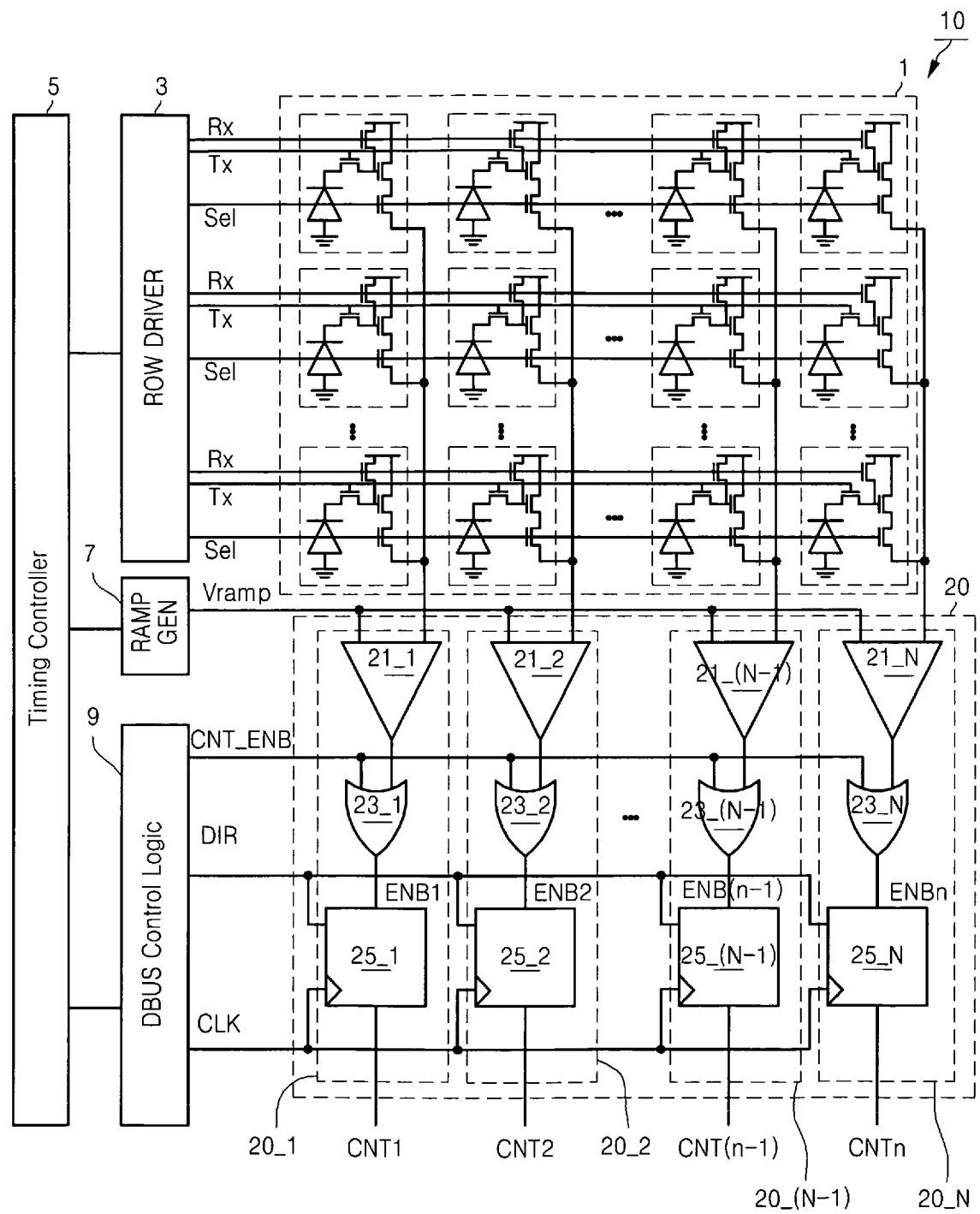
FIG. 1 is a block diagram of an image sensor according to example embodiments.

Example embodiments will now be described more fully hereinafter with reference to the accompanying drawings, in which example embodiments are shown. Example embodiments may, however, be embodied in many different forms and should not be construed as limited to the example embodiments set forth herein. Rather, example embodiments are provided so that this disclosure will be thorough and complete, and will fully convey the concept of the invention to those skilled in the art. Like reference numerals in the drawings denote like elements, and thus, their description may not be repeated.

Example embodiments will be more clearly understood from the detailed description taken in conjunction with the accompanying drawings.

Detailed illustrative embodiments of example embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, various embodiments will be described in detail with reference to the attached drawings.

Although example embodiments have been disclosed for illustrative purposes, those skilled in the art will appreciate that various modifications, additions and substitutions are possible, without departing from the scope and spirit of the invention as disclosed in the accompanying claims.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.). As used herein, the term "and/or"

includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image sensor 10 according to example embodiments. The image sensor 10 includes a timing controller 5, a row driver 3, an active pixel sensor (APS) array 1, a ramp generator 7, a controller 9, and/or an analog-to-digital converter (ADC) block 20.

Referring to FIG. 1, the timing controller 5 may output a plurality of control signals to control the row driver 3, the ramp generator 7, and/or the controller 9. The row driver 3 may output a plurality of control signals Rx, Tx, and Sel to control the operations of a plurality of pixels included in the APS array 1 based on control signals, for example, an address signal output from the timing controller 5. The pixels in the APS array 1 may output video signals, for example, a reset signal and an image signal, in units of columns based on the control signals Rx, Tx, and Sel provided from the row driver 3. The ramp generator 7 may output a reference signal, for example, a ramp signal Vramp based on at least one control signal provided from the timing controller 5.

The controller 9 may output a plurality of control signals CNT_ENB, DIR, and CLK to control the ADC block 20 based on at least one control signal output from the timing controller 5. The plurality of control signals CNT_ENB, DIR, and CLK may include a direction indicating signal DIR to control the operations of a plurality of counter arrays 25_1, 25_2, ..., 25_(N−1), and 25_N included in the ADC block 20 and a first control signal CNT_ENB to control the operations of a plurality of control signal generators 23_1, 23_2, ..., 23_(N−1), and 23_N included in the ADC block 20.

The ADC block 20 may include a plurality of ADC units 20_1, 20_2, ..., 20_(N−1), and 20_N each of which may convert an analog video signal output in units of columns from the APS array 1 into a digital signal. The ADC units 20_1 through 20_N may include comparators 21_1, 21_2, ..., 21_(N−1), and 21_N, the control signal generators 23_1 through 23_N, and/or the counter arrays 25_1 through 25_N, respectively.

The comparators 21_1 through 21_N may compare video signals output in units of columns from the APS array 1 with the ramp signal Vramp output from the ramp generator 7 and output the comparison results. For instance, each of the comparators 21_1 through 21_N may output a comparison signal at a first level, for example, a low level, when a voltage level of the ramp signal Vramp is higher than that of a video signal and may output the comparison signal at a second level, for example, a high level, when the voltage level of the ramp signal is lower than that of the video signal. However, each of the comparators 21_1 through 21_N may output a comparison signal at an opposite level to that of the above-described comparison signal according to the polarity of an input terminal.

The control signal generators 23_1 through 23_N may output operation control signals ENB1, ENB2, ..., ENB(n−1), and ENBn, respectively, in response to the first control signal CNT_ENB output from the controller 9 and the comparison signals output from the comparators 21_1 through 21_N, respectively. For example, each of the control signal generators 23_1 through 23_N may be implemented by an OR circuit and output the operation control signal ENB1, ENB2, ..., ENB(n−1), or ENBn at the second level when the first control signal CNT_ENB output from the controller 9 or the comparison signal output from the comparator 21_1, 21_2, ..., 21_(N−1), or 21_N is at the second level.

The operation control signals ENB1 through ENBn may control the operations of the counter arrays 25_1 through 25_N, respectively. Furthermore, the control signal generators 23_1 through 23_N may be omitted. The operations of the counter arrays 25_1 through 25_N may be controlled by the level, for example, the first or second level of the first control signal CNT_ENB output from the controller 9.

The counter arrays 25_1 through 25_N may perform an up-count operation or a down-count operation in response to the operation control signals ENB1 through ENBn, respectively, provided from the control signal generators 23_1 through 23_N, respectively, and the direction indicating signal DIR provided from the controller 9 and output count signals CNT1, CNT2, ..., CNT(n−1), CNTn, respectively. For example, each of the counter arrays 25_1 through 25_N may perform counting when the operation control signal ENB1, ENB2, ..., ENB(n−1), or ENBn, respectively, provided from the control signal generators 23_1, 23_2, ..., 23_(N−1), or 23_N is at the first level, respectively.

Nonetheless, when the direction indicating signal DIR provided from the controller 9 is at the first level, the counter arrays 25_1 through 25_N may perform a down-count operation and output the count signals CNT1 through CNTn, respectively. When the direction indicating signal DIR provided from the controller 9 may be at the second level, the counter arrays 25_1 through 25_N may perform an up-count operation and output the count signals CNT1 through CNTn, respectively. Each of the count signals CNT1 through CNTn may include a plurality of bits. When the operation control signals ENB1 through ENBn provided from the control signal generators 23_1 through 23_N are at the second level, the counter arrays 25_1 through 25_N, respectively, may perform a holding operation.

Figure 2:
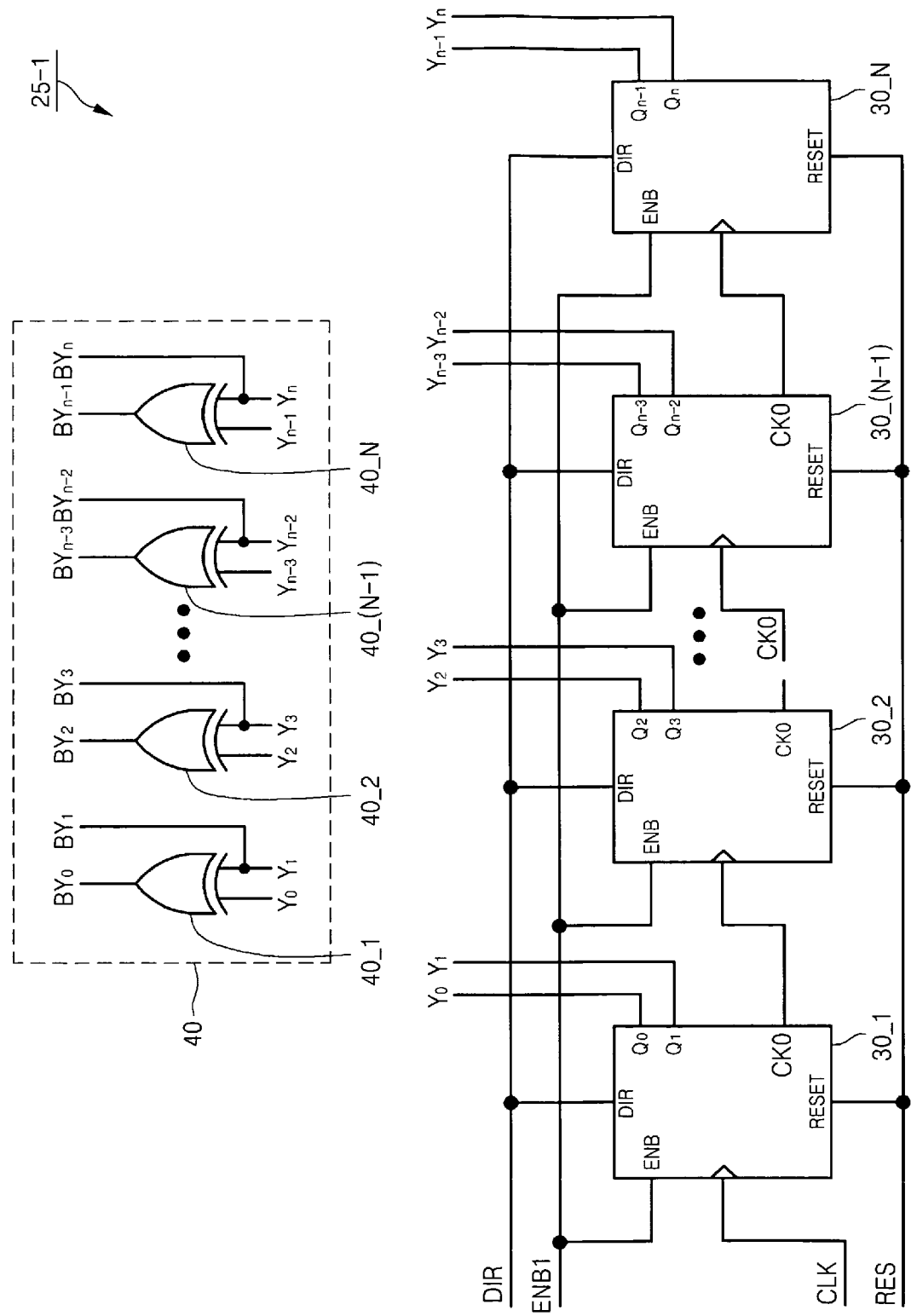
FIG. 2 is an example circuit diagram of a counter array illustrated in FIG. 1.

FIG. 2 is an example circuit diagram of the counter array 25_1 illustrated in FIG. 1. In example embodiments, the structures and the operations of the counter arrays 25_1 through 25_N are substantially the same. Thus, as an example, the structure and the operation of the first counter array 25_1 will be described.

Referring to FIG. 2, the counter array 25_1 may include a plurality of counter units 30_1, 30_2, ..., 30_(N−1), and 30_N. Each of the counter units 30_1 through 30_N may output a gray codeword having at least two bits in length. Because the gray codeword has a small number of bits that make a state transition at the same time, the instant current change of each counter may be reduced. In a gray codeword (or more generally, a reflected code word), two successive outputs differ by a smaller number of bits (for example, less than all the bits, never all the bits or, only a single bit) when toggled at one time in the counter. In contrast, a BCD codeword scheme may have a larger number of bits (for example more than one or all) toggled at any even given moment of a counter operation. As an example of a gray codeword, when each of the counter units 30_1 through 30_N outputs an N-bit gray codeword, the number of bits that make the state transition at the same time in each of the counter units 30_1 through 30_N may be about N/2, and therefore, the instant current change of each of the counter units 30_1 through 30_N, may be reduced.

The counter units 30_1 through 30_N may externally receive a plurality of control signals from, for example, the controller 9 (FIG. 1) and the control signal generator 23_1 (FIG. 1). For example, each of the counter units 30_1 through 30_N may receive a clock signal CLK, a reset signal RES, and the direction indicating signal DIR from the controller 9 and also may receive, for example, the operation control signal ENB1 from the control signal generator 23_1.

For example, the operation control signal ENB1 from the control signal generator 23_1 may control the counter units 30_1 through 30_N to perform a counting operation or a holding operation. The direction indicating signal DIR from the controller 9 may control the counter units 30_1 through 30_N to perform an up-count operation or a down-count operation. For instance, when the operation control signal ENB1 is at the first level, for example, the low level may be provided to the counter units 30_1 through 30_N, the counter units 30_1 through 30_N perform a counting operation.

When the direction indicating signal DIR is at the first level, for example, the low level may be provided to the counter units 30_1 through 30_N, the counter units 30_1 through 30_N perform a down-count operation. When the direction indicating signal DIR is at the second level, for example, the high level may be provided to the counter units 30_1 through 30_N, the counter units 30_1 through 30_N perform an up-count operation.

Also, when the operation control signal ENB1 is at the second level, for example, the high level may be provided to the counter units 30_1 through 30_N, the counter units 30_1 through 30_N perform a holding operation. The clock signal CLK may be provided to the first counter unit 30_1 among the counter units 30_1 through 30_N. Each of the counter units 30_2 through 30_N other than the first counter unit 30_1 may receive an output signal of a previous counter unit as a clock signal. Accordingly, each of the counter units 30_1 through 30_N may operate as a ripple counter. Also, the reset signal RES may reset the counter units 30_1 through 30_N.

The counter array 25_1 may also include a decoder 40 which may convert N-bit gray codewords $Y_0$, $Y_1$, $Y_2$, $Y_3$, ..., $Y_{n-3}$, $Y_{n-2}$, $Y_{n-1}$, and $Y_n$ output from the counter units 30_1 through 30_N into binary coded decimal (BCD) codewords $BY_0$, $BY_1$, $BY_2$, $BY_3$, ..., $BY_{n-3}$, $BY_{n-2}$, $BY_{n-1}$, and $BY_n$. The decoder 40 may include a plurality of XOR gates 40_1, 40_2, ..., 40_(N-1), and 40_N. For example, the decoder 40 may perform an XOR operation with respect to the N-bit gray codewords $Y_0$ through $Y_n$ output from the counter units 30_1 through 30_N and may output the N-bit BCD codewords $BY_0$ through $BY_n$.

Figure 3:
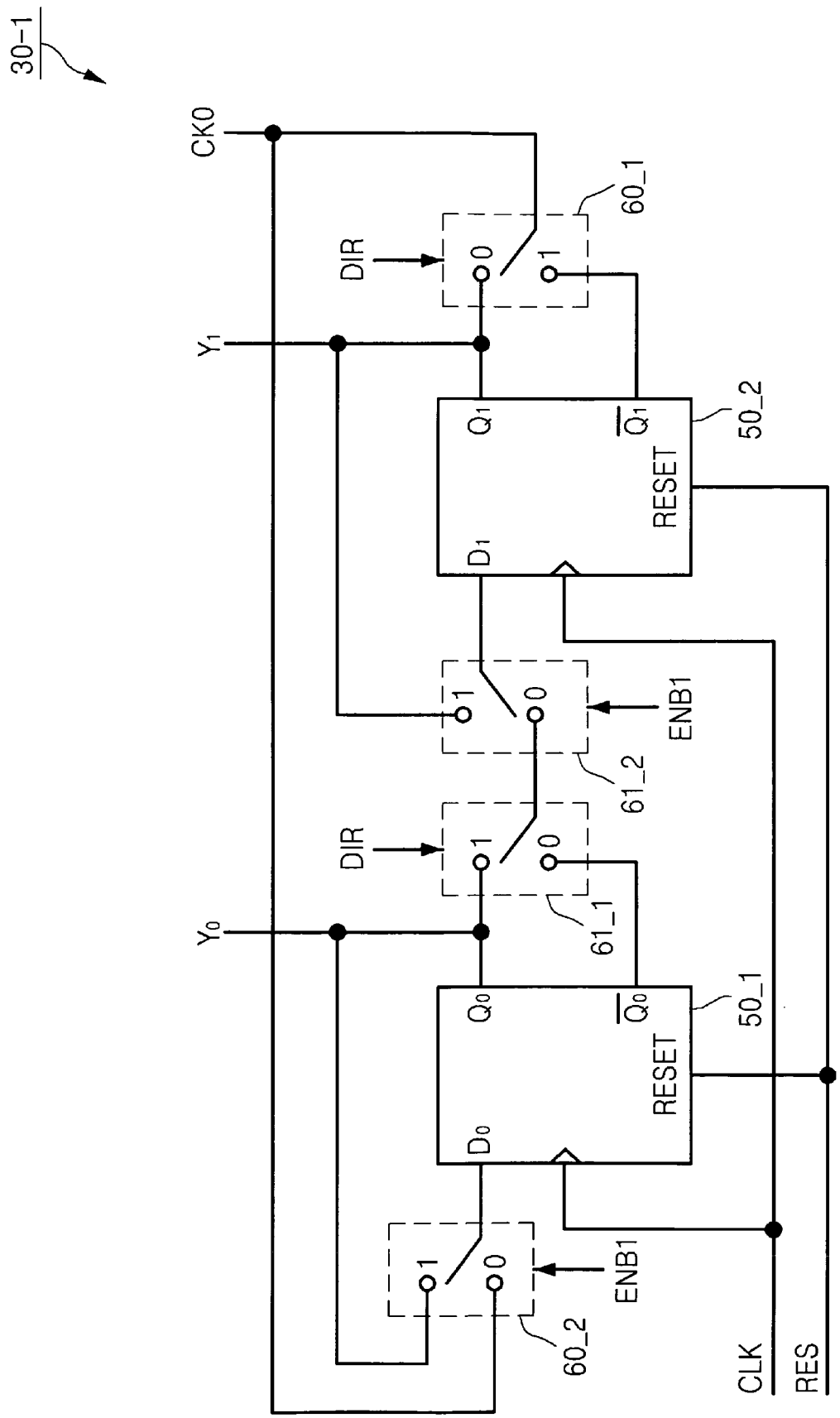
FIG. 3 is an example circuit diagram of a first counter unit among a plurality of counter units illustrated in FIG. 2.
Figure 4:
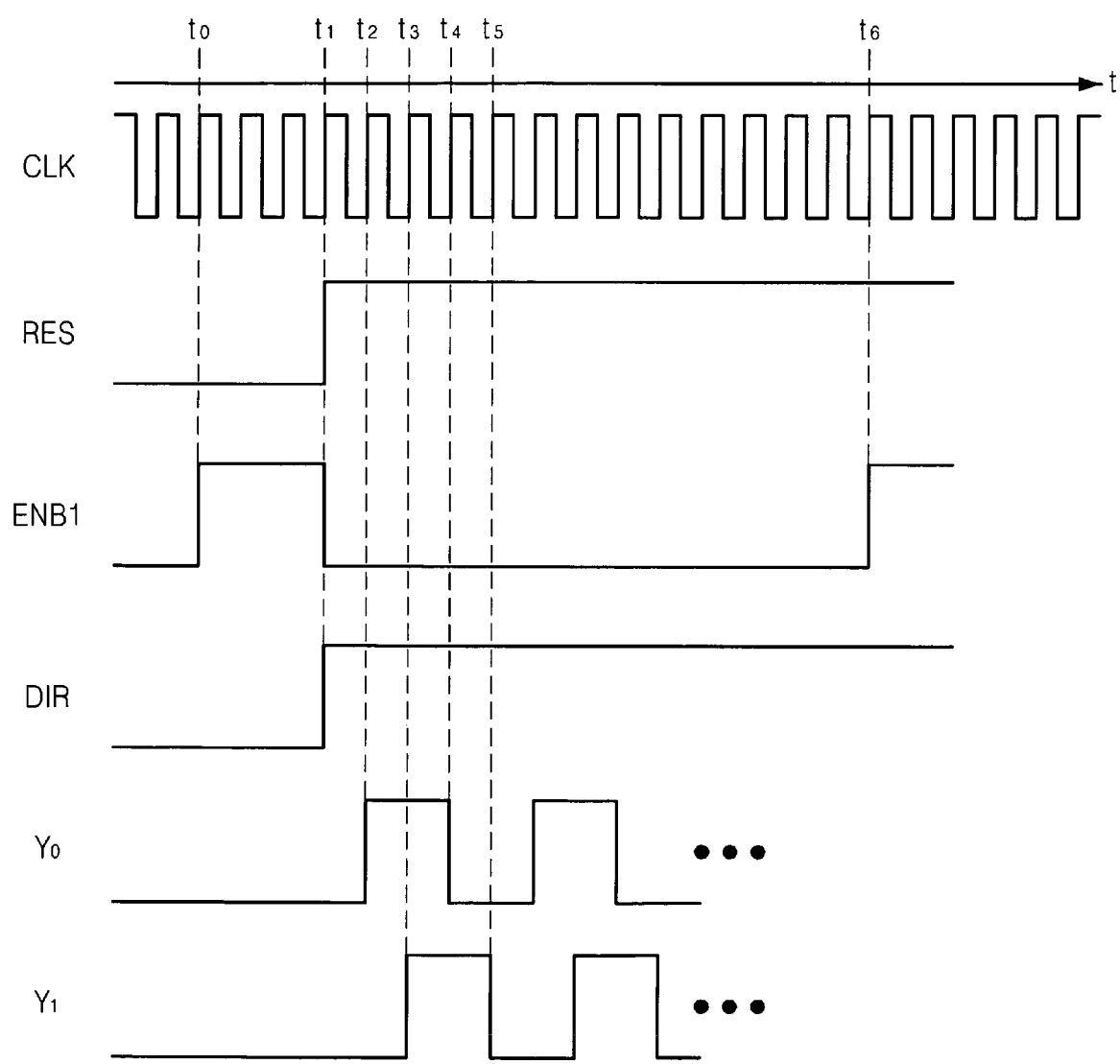
FIG. 4 is an example timing chart illustrating a first operation of the counter unit illustrated in FIG. 3.
Figure 5:
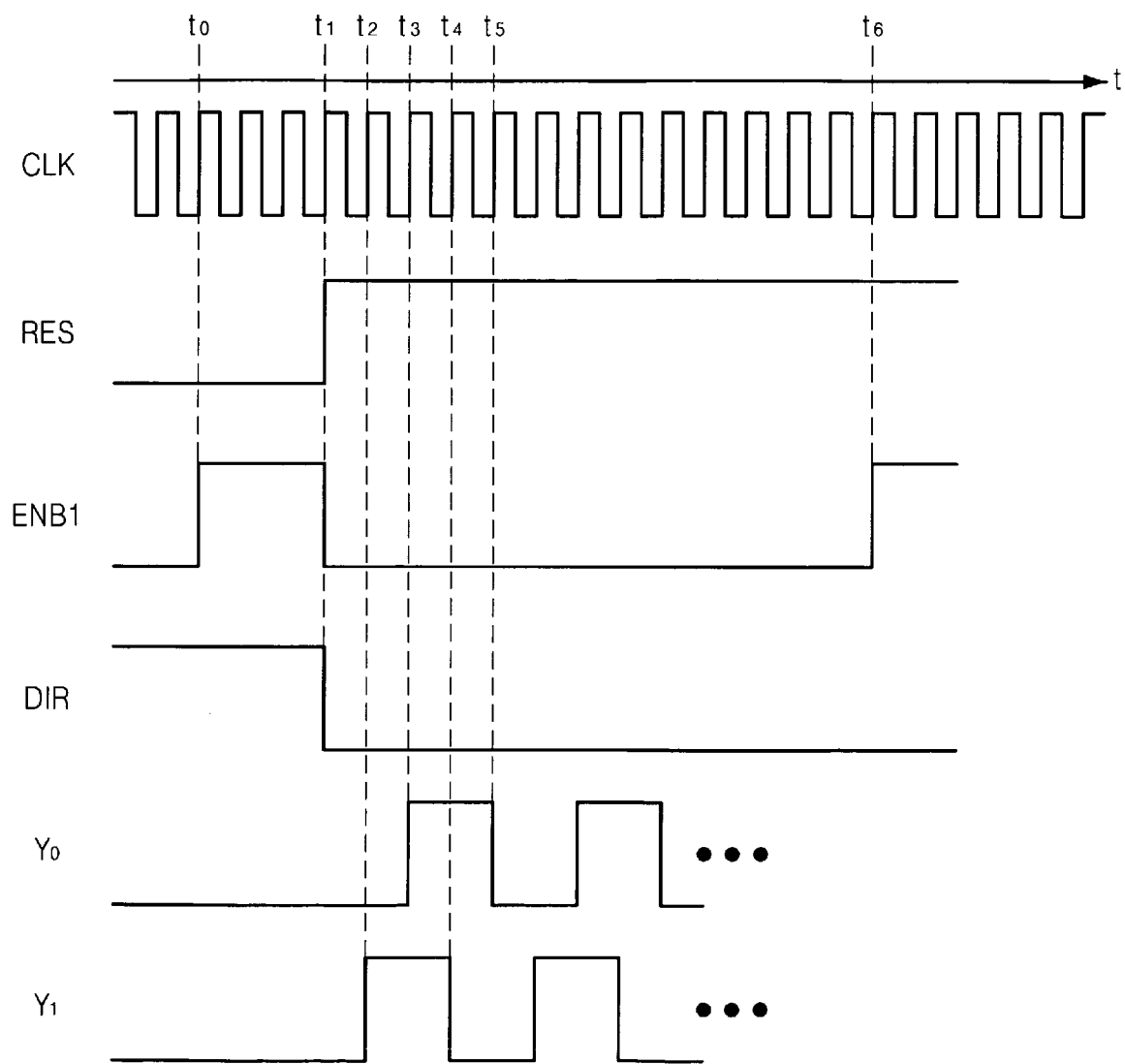
FIG. 5 is an example timing chart illustrating a second operation of the counter unit illustrated in FIG. 3.

Referring to FIGS. 3 through 5, the structures and the operations of the counter units 30_1 through 30_N will be described in detail. The structures and the operations of the counter units 30_1 through 30_N may be substantially similar. Thus, as an example, the structure and the operation of the first counter unit 30_1 among the counter units 30_1 through 30_N will be described. FIG. 3 is an example circuit diagram of the first counter unit 30_1 illustrated in FIG. 2. FIG. 4 is an example timing chart illustrating a first operation of the counter unit 30_1 illustrated in FIG. 3. FIG. 5 is an example timing chart illustrating a second operation of the counter unit 30_1 illustrated in FIG. 3.

Referring to FIG. 3, the counter unit 30_1 may include a plurality of latches 50_1 and 50_2 and/or a plurality of switches 60_1, 60_2, 61_1, and 61_2. The latches 50_1 and 50_2 may operate in response to the clock signal CLK provided from, for example, the controller 9 (FIG. 1). For example, the plurality of the latches 50_1 and 50_2 may include the first latch 50_1 and the second latch 50_2. Each of the first and second latches 50_1 and 50_2 may operate as a synchronous counter in response to the clock signal CLK output from the controller 9 though example embodiments may not restricted thereto. The first and second latches 50_1 and 50_2 may operate in response to an output signal of a previous counter unit. Each of the first and second latches 50_1 and 50_2 may be implemented by a D flip-flop.

The switches 60_1 through 61_2 may be connected with output and input terminals of the second and first latches 50_2 and 50_1. For example, a first switch unit may include the first switch 60_1 and the second switch 60_2 which may be respectively connected with the input terminal of the first latch 50_1 and the output terminal of the second latch 50_2. A second switch unit may include the third switch 61_1 and the fourth switch 61_2 which may be respectively connected with the output terminal of the first latch 50_1 and the input terminal of the second latch 50_2. The first switch unit 60_1 and 60_2 and the second switch unit 61_1 and 61_2 switch in response to the control signals ENB1 and DIR provided from the outside the counter unit 30_1, so as to control input signals provided to the input terminals of the first and second latches 50_1 and 50_2.

In the first switch unit, the first switch 60_1 may output a first output signal Q1 or a second output signal Q1' of the second latch 50_2 in response to the direction indicating signal DIR output from the controller 9. The second switch 60_2 may provide a first output signal Q0 of the first latch 50_1 or an output signal of the first switch 60_1 to the input terminal of the first latch 50_1 in response to the operation control signal ENB1 from the control signal generator 23_1 (FIG. 1).

In the second switch unit, the third switch 61_1 may output the first output signal Q0 or a second output signal Q0' of the first latch 50_1 in response to the direction indicating signal DIR from the controller 9. The fourth switch 61_2 may provide the first output signal Q1 of the second latch 50_2 or an output signal of the third switch 61_1 to the input terminal of the second latch 50_2 in response to the operation control signal ENB1 from the control signal generator 23_1.

Hereinafter, the first operation, for example, an up-count operation of the counter unit 30_1 will be described with reference to the following table 1 and FIGS. 3 and 4.

TABLE 1

| | BCD CODEWORD | Gray CODEWORD |
|---|---|---|
| 0 | 00 | 00 |
| 1 | 01 | 01 |
| 2 | 10 | 11 |
| 3 | 11 | 10 |

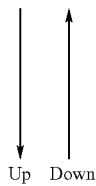

Up   Down

During a period $t_0$ to $t_1$ on the time axis "t" in FIG. 4, the reset signal RES at the first level, for example, the low level may be provided to the counter unit 30_1. Accordingly, the first latch 50_1 and the second latch 50_2 each may be reset and may output a level-0 gray codeword "00". Also, the operation control signal ENB1 at the second level, for example, the high level may be provided to the counter unit 30_1. Accordingly, each of the first and second latches 50_1 and 50_2 may hold an output value in a previous state, for example, an output value in the reset state.

For example, when the operation control signal ENB1 at the second level may be provided from the control signal generator 23_1, the second switch 60_2 in the first switch unit and the fourth switch 61_2 in the second switch unit perform a switching operation. Accordingly, the first output signal Q0 of the first latch 50_1 may be provided t to the input terminal of the first latch 50_1, and the first output signal Q1 of the second latch 50_2 may be provided to the input terminal of the second latch 50_2. The first and second latches 50_1 and 50_2 may perform a holding operation in which a previous output state is held.

At a time point $t_1$ on the time axis "t", in response to a rising edge of the clock signal CLK, the reset signal RES and the direction indicating signal DIR transit to the second level and the operation control signal ENB1 may transitions to the first level. Accordingly, the first and second latches 50_1 and 50_2 may perform the up-count operation.

For example, at the time point $t_1$ on the time axis "t", the reset signal RES makes a state transition to the second level. Accordingly, the first latch 50_1 and the second latch 50_2 may be released from the reset state. When the direction indicating signal DIR transitions to the second level at the time point $t_1$, the first switch 60_1 in the first switch unit and the third switch 61_1 in the second switch unit may perform a switching operation. For example, the first switch 60_1 outputs the second output signal Q1' of the second latch 50_2 and the third switch 61_1 outputs the first output signal Q0 of the first latch 50_1.

When the operation control signal ENB1 transitions to the first level at the time point $t_1$, the second switch 60_2 in the first switch unit and the fourth switch 61_2 in the second switch unit may perform a switching operation. The second switch 60_2 may provide the output of the first switch 60_1, for example, the second output signal Q1' of the second latch 50_2 to the input terminal of the first latch 50_1. The fourth switch 61_2 may provide the output of the third switch 61_1, for example, the first output signal Q0 of the first latch 50_1 to the input terminal of the second latch 50_2.

Accordingly, the first latch 50_1 and the second latch 50_2 may perform the up-count operation in which a single cycle of the clock signal CLK may be counted and sequentially output gray codewords in increasing order. For example, during a period $t_1$ to $t_2$ on the time axis "t", the first latch 50_1 and the second latch 50_2 may output the level-0 gray codeword "00". In response to each rising edge of the clock signal CLK, the first latch 50_1 and the second latch 50_2 output a level-1 gray codeword "01" during a period $t_2$ to $t_3$ on the time axis "t", a level-2 gray codeword "11" during a period $t_3$ to $t_4$, and a level-3 gray codeword "10" during a period of $t_4$ to $t_5$.

The up-count operation of the first and second latches 50_1 and 50_2 may be repeated until the operation control signal ENB1 transitions to the second level at a time point $t_6$ on the time axis "t". When the operation control signal ENB1 transitions to the second level at the time point $t_6$, the second switch 60_2 in the first switch unit and the fourth switch 61_2 in the second switch unit may perform a switching operation so as to hold previous output values in the first latch 50_1 and the second latch 50_2.

Also, as is shown in the above table 1, the gray codewords output from the counter unit 30_1 including the first latch 50_1 and the second latch 50_2 may be different from the BCD codewords. For example, although a level-1 BCD codeword "01" is the same as the level-1 gray codeword "01", all bits in the level-1 BCD codeword "01" make a transition to come up to a level-2 BCD codeword "10", and only one bit in the level-1 gray codeword "01" may make a transition to come up to the level-2 gray codeword "11".

According to example embodiments, the counter unit 30_1 may be implemented by a gray counter unit that outputs an N-bit gray codeword and thus may reduce a maximum number of bits that make a state transition or toggle to N/2, thereby reducing an instant current change as compared to a conventional counter unit that outputs a BCD codeword. The first output signal Q1 or the second output signal Q1' of the second latch 50_2 may be provided to a subsequent counter unit as a clock signal CK0.

Hereinafter, the second operation, for example, a down-count operation of the counter unit 30_1 will be described with reference to the above table 1 and FIGS. 3 and 5.

Referring to FIG. 5, during a period $t_0$ to $t_1$ on the time axis "t", the reset signal RES at the first level, for example, the low level is provided to the counter unit 30_1. Accordingly, the first latch 50_1 and the second latch 50_2 each is reset and outputs the level-0 gray codeword "00". Also, the operation control signal ENB1 at the second level, for example, the high level is provided to the counter unit 30_1. Accordingly, each of the first and second latches 50_1 and 50_2 may hold an output value in a previous state, for example, an output value in the reset state.

For example, when the operation control signal ENB1 at the second level is provided from the control signal generator 23_1, the second switch 60_2 in the first switch unit and the fourth switch 61_2 in the second switch unit perform a switching operation (0→1). Accordingly, the first output signal Q0 of the first latch 50_1 may be provided to the input terminal of the first latch 50_1 and the first output signal Q1 of the second latch 50_2 may be provided to the input termi- nal of the second latch 50_2. Thus, the first and second latches 50_1 and 50_2 may perform a holding operation in which a previous output state may beheld.

At a time point to on the time axis "t", in response to a rising edge of the clock signal CLK, the reset signal RES may transitions to the second level and the operation control signal ENB1 and the direction indicating signal DIR may transit to the first level. Accordingly, the first and second latches 50_1 and 50_2 may perform the down-count operation.

For example, at the time point $t_1$ on the time axis "t", the reset signal RES makes a state transition to the second level. Accordingly, the first latch 50_1 and the second latch 50_2 are released from the reset state. When the direction indicating signal DIR transitions to the first level at the time point $t_1$, the first switch 60_1 in the first switch unit and the third switch 61_1 in the second switch unit perform a switching operation (1→0). The first switch 60_1 may output the first output signal Q1 of the second latch 50_2 and the third switch 61_1 may output the second output signal Q0 of the first latch 50_1.

When the operation control signal ENB1 transitions to the first level at the time point $t_1$, the second switch 60_2 in the first switch unit and the fourth switch 61_2 in the second switch unit may perform a switching operation. The second switch 60_2 provides the output of the first switch 60_1, for example, the first output signal Q1 of the second latch 50_2 to the input terminal of the first latch 50_1. The fourth switch 61_2 may provide the output of the third switch 61_1, for example, the second output signal Q0' of the first latch 50_1 to the input terminal of the second latch 50_2. Accordingly, the first latch 50_1 and the second latch 50_2 may perform the down-count operation in which a single cycle of the clock signal CLK may be counted and sequentially may output the gray codewords in decreasing order.

For example, during a period $t_1$ to $t_2$ on the time axis "t", the first latch 50_1 and the second latch 50_2 output the level-0 gray codeword "00". In response to each rising edge of the clock signal CLK, the first latch 50_1 and the second latch 50_2 output: the level-3 gray codeword "10" during a period $t_2$ to $t_3$ on the time axis "t"; the level-2 gray codeword "11" during a period $t_3$ to $t_4$; and the level-1 gray codeword "01" during a period of $t_4$ to $t_5$.

The down-count operation of the first and second latches 50_1 and 50_2 may be repeated until the operation control signal ENB1 transitions to the second level at a time point $t_6$ on the time axis "t". When the operation control signal ENB1 transitions to the second level at the time point $t_6$, the second switch 60_2 in the first switch unit and the fourth switch 61_2 in the second switch unit may perform a switching operation so as to hold the first latch 50_1 and the second latch 50_2.

The first output signal Q1 or the second output signal Q1' of the second latch 50_2 may be provided to a subsequent counter unit as the clock signal CK0.

Hereinafter, the operation of the counter array 25_1 illustrated in FIG. 2 will be described with reference to FIG. 6. For clarity of the description, as an example, the counter array 25_1 outputs a 4-bit gray codeword.

Figure 6:
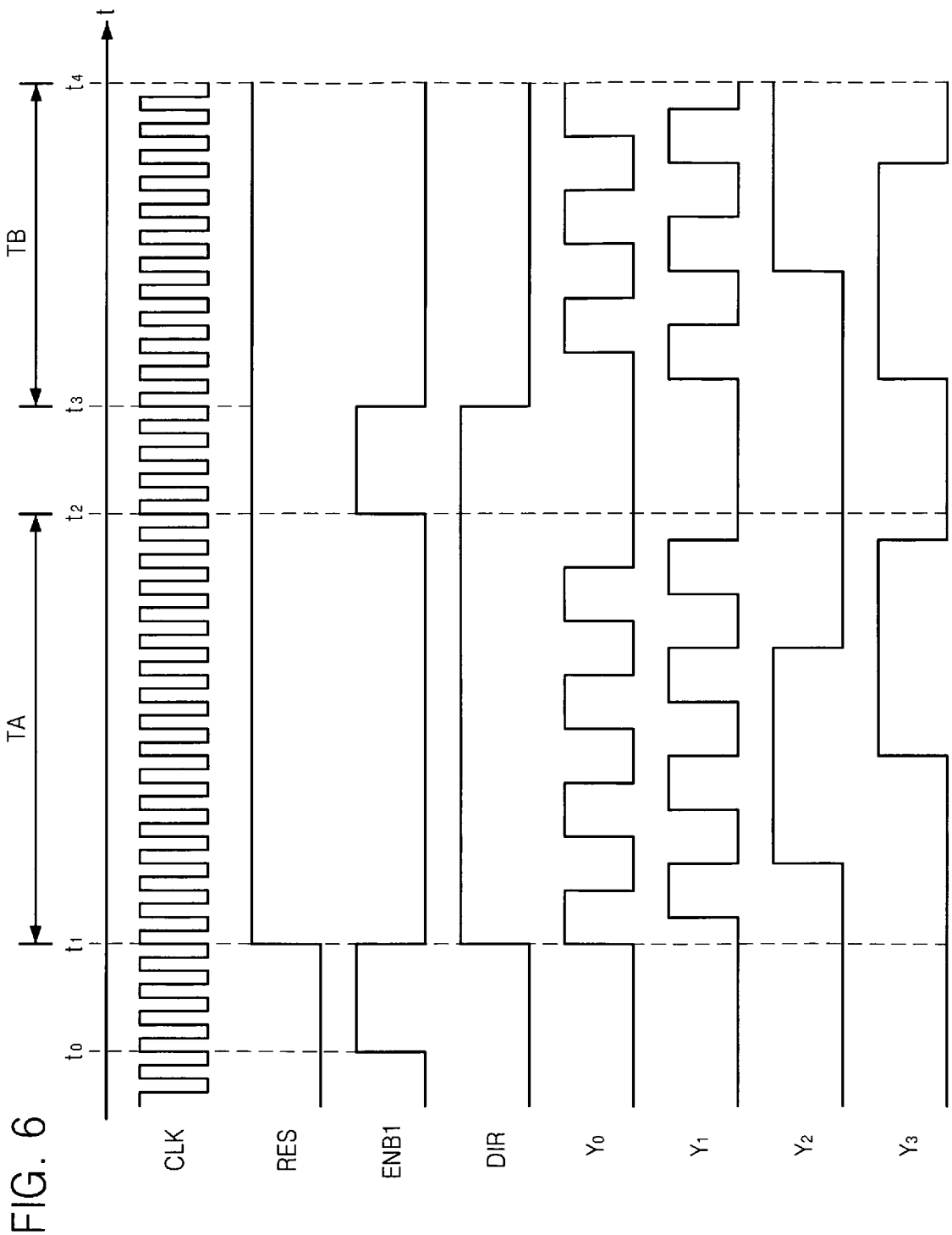
FIG. 6 is an example timing chart illustrating the operation of the counter array illustrated in FIG. 2.

FIG. 6 is an example timing chart illustrating the operation of the counter array 25_1 illustrated in FIG. 2. Referring to FIGS. 2 and 6, during a period $t_0$ to $t_1$ on the time axis "t" in FIG. 6, the reset signal RES may be at the first level, for example, the low level may be provided to the first counter unit 30_1 and the second counter unit 30_2 in the counter array 25_1. Accordingly, the first counter unit 30_1 and the second counter unit 30_2 each may reset. Also, the operation control signal ENB1 may be at the second level, for example, the high level may be provided to the first counter unit 30_1 and the second counter unit 30_2. Accordingly, the first counter unit 30_1 and the second counter unit 30_2 may be held.

At a time point to on the time axis "t", in response to a rising edge of the clock signal CLK, the reset signal RES and the direction indicating signal DIR transit to the second level and the operation control signal ENB1 transitions to the first level. Accordingly, the first counter unit 30_1 and the second counter unit 30_2 may perform the up-count operation during a period $t_1$ to $t_2$, for example, a TA period on the time axis "t".

For example, the first counter unit 30_1 may sequentially increase in response to the clock signal CLK and may output 2-bit gray codewords in level increasing order during the TA period. Also, the second counter unit 30_2 may receive an output signal of the first counter unit 30_1 as a clock signal, and may sequentially increase in response to the received clock signal, and may output 2-bit gray codewords in level increasing order during the TA period. For example, the first counter unit 30_1 may operate in response to the clock signal CLK provided from the controller 9 (FIG. 1) and the second counter unit 30_2 may operate as a ripple counter that receives an output signal of the first counter unit 30_1, for example, the first output signal Q1 or the second output signal Q1' of the second latch 50_2 (FIG. 3) in the first counter unit 30_1 as a clock signal and may operate in response to the clock signal.

Further, when the operation control signal ENB1 transitions to and stays at the second level during a period $t_2$ to $t_3$ on the time axis "t", the first counter unit 30_1 and the second counter unit 30_2 are held. At the time point $t_3$ on the time axis "t", in response to a rising edge of the clock signal CLK, the direction indicating signal DIR transitions to the first level and the operation control signal ENB1 transitions to the first level. The first counter unit 30_1 and the second counter unit 30_2 may perform the down-count operation during a period $t_3$ to $t_4$, for example, a TB period on the time axis "t".

For example, the first counter unit 30_1 sequentially decreases in response to the clock signal CLK and may output 2-bit gray codewords in level decreasing order during the TB period. Also, the second counter unit 30_2 may receive an output signal of the first counter unit 30_1 as a clock signal, sequentially may decrease in response to the received clock signal, and may output 2-bit gray codewords in level decreasing order during the TB period. For example, the first counter unit 30_1 may operate in response to the clock signal CLK provided from the controller 9 and the second counter unit 30_2 may operate as a ripple counter that receives the first output signal Q1 or the second output signal Q1' of the second latch 50_2 of the first counter unit 30_1 as a clock signal and operates in response to the clock signal.

According to example embodiments, the number of bits that make a state transition simultaneously may be reduced by half as compared to the conventional art when a plurality of counter units in a counter array of an image sensor perform an up-count operation or a down-count operation, so that instant current in the counter array may be reduced, and therefore, an instant current change may be reduced. As a result, an operating margin may be increased. In addition, a counter array according to example embodiments may be illustrated as a conventional BCD counter.

While example embodiments have been particularly shown and described with reference to FIGS. 1-6, it will be understood by those of ordinary skill in the art that various changes in forms and details may be made without departing from the spirit and scope of example embodiments as defined by the following claims.

What is claimed is:

1. A counter array comprising:
   a controller configured to output an operation control signal and a direction indication signal;
   a plurality of counter units configured to perform one of holding previous output values and a counter operation in response to the operation control signal, wherein each counter unit includes
   a first latch and a second latch each including a data input terminal and a clock input terminal,
   a first switch configured to selectively provide a first output signal of the first latch to the data input terminal of the first latch based on the operation control signal, and a second switch configured to selectively provide a first output signal of the second latch to the data input terminal of the second latch based on the operation control signal, and wherein the counter operation performs one of an up-count operation and a down-count operation in response to the direction indication signal.

2. The counter array of claim 1, wherein the first latch is configured to output the first output signal of the first latch and a second output signals of the first latch, the second latch is configured to output the first output signal of the first latch and a second output signals of the second latch, the first switch unit is configured to transmit one of the first output signal of the first latch, the first output signal of the of the second latch, and the second output signal of the second latch to an input terminal of the first latch in response to the operation control signal and the direction indication signal; and the second switch unit is configured to transmit one of the first output signal of the first latch, the second output signal of the first latch, and the first output signal of the second latch to an input terminal of the second latch in response to the operation control signal and the direction indication signal.

3. The counter array of claim 2, wherein each of the first switch units comprises:

a first switch configured to output one of the first output signal of the second latch and the second output signal of the second latch in response to the direction indication signal; and a second switch configured to output one of the first output signal of the first latch and an output signal of the first switch to the input terminal of the first latch in response to the operation control signal.

4. The counter array of claim 2, wherein each of the second switch units comprises:

a third switch configured to output one of the first output signal of the first latch and the second output signal of the first latch in response to the direction indication signal; and a fourth switch configured to output one of the first output signal of the second latch and an output signal of the third switch to the input terminal of the second latch in response to the operation control signal.

5. The counter array of claim 2, wherein each of the first latches and the second latches is a D flip-flop.

6. The counter array of claim 1, wherein a clock output signal outputted by a preceding counter unit of the plurality of counter units is inputted to a succeeding counter unit in the plurality of counter units as a clock input signal.

7. The counter array of claim 1, wherein each counter unit of the plurality of counter units outputs a 2-bit gray codeword and includes a decoder configured to convert the 2-bit gray codeword into a binary coded decimal (BCD) codeword.

8. The counter array of claim 7, wherein the decoder includes a plurality of XOR gates.

9. An image sensor comprising:

an active pixel sensor (APS) array configured to sense light and output an image signal;

a ramp generator configured to output a ramp signal;

a controller configured to output a direction indication signal and a control signal;

a comparator configured to compare the ramp signal with the image signal and output a comparison signal;

a control signal generator configured to output an operation control signal in response to the control signal and the comparison signal; and a counter array including a counter unit configured to one of hold previous output values and a counting operation in response to the operation control signal, wherein the counter unit includes a first latch and a second latch each including a data input terminal and a clock input terminal, a first switch configured to selectively provide a first output signal of the first latch to the data input terminal of the first latch based on the operation control signal, and a second switch configured to selectively provide a first output signal of the second latch to the data input terminal of the second latch based on the operation control signal, and wherein the counter operation performs one of an up-count operation and a down-count operation in response to the direction indication signal.

10. The image sensor of claim 9, wherein the first latch is configured to output the first output signal of the first latch and a second output signals of the first latch, the second latch is configured to output the first output signal of the first latch and a second output signals of the second latch, the first switch unit is configured to transmit one of the first output signal of the first latch, the first output signal of the of the second latch, and the second output signal of the second latch to an input terminal of the first latch in response to the operation control signal and the direction indication signal; and the second switch unit is configured to transmit one of the first output signal of the first latch, the second output signal of the first latch, and the first output signal of the second latch to an input terminal of the second latch in response to the operation control signal and the direction indication signal.

11. The image sensor of claim 10, wherein the first switch unit comprises:

a first switch configured to output one of the first output signal of the second latch and the second output signal of the second latch in response to the direction indication signal; and a second switch configured to output one of the first output signal of the first latch and an output signal of the first switch to the input terminal of the first latch in response to the operation control signal.

12. The image sensor of claim 10, wherein the second unit comprises:

a third switch configured to output one of the first output signal of the first latch and a second output signal of the first latch in response to the direction indication signal; and a fourth switch configured to output one of the first output signal of the second latch and an output signal of the third switch to the input terminal of the second latch in response to the operation control signal.

13. The image sensor of claim 10, wherein the first latch and the second latch are D flip-flops.

14. The image sensor of claim 9, wherein the counter unit outputs a 2-bit gray codeword and includes a decoder configured to convert the 2-bit gray codeword into a binary coded decimal (BCD) codeword.

15. The image sensor of claim 14, wherein the decoder includes a plurality of XOR gates.

16. The image sensor of claim 9, wherein the image sensor is a CMOS image sensor.

17. The CMOS image sensor of claim 16, wherein the CMOS image sensor includes a single analog-to-digital converter scheme.

18. The CMOS image sensor of claim 16, wherein the CMOS image sensor includes a column analog-to-digital converter scheme.

19. The CMOS image sensor of claim 16, wherein the CMOS image sensor is used during digital correlated double sampling (CDS).

* * * * *